United States Patent
Su et al.

(10) Patent No.: US 8,044,427 B2
(45) Date of Patent: Oct. 25, 2011

(54) LIGHT EMITTING DIODE SUBMOUNT WITH HIGH THERMAL CONDUCTIVITY FOR HIGH POWER OPERATION

(75) Inventors: Wen-Herng Su, Moraga, CA (US);
Junying Lu, Castro Valley, CA (US);
Ho-Shang Lee, El Sobrante, CA (US)

(73) Assignee: DiCon Fiberoptics, Inc., Richmond, CA (US)

(*) Notice: Subject to any disclaimer, the term of this patent is extended or adjusted under 35 U.S.C. 154(b) by 429 days.

(21) Appl. No.: 12/145,395

(22) Filed: Jun. 24, 2008

(65) Prior Publication Data

US 2009/0315062 A1 Dec. 24, 2009

(51) Int. Cl.
*H01L 33/00* (2010.01)

(52) U.S. Cl. ............ 257/99; 257/81; 257/618; 257/707; 257/E33.063; 438/26; 362/235; 362/294; 362/373; 362/547; 362/800; 313/46; 29/726; 29/832; 29/840; 29/842; 29/843; 29/846

(58) Field of Classification Search ............... 257/81, 257/99, 618, 707, E33.063; 438/26; 362/235, 362/249, 294, 373, 547, 800; 313/46; 29/726, 29/832, 840, 842, 843, 846
See application file for complete search history.

(56) References Cited

U.S. PATENT DOCUMENTS

| | | | |
|---|---|---|---|
| 3,864,219 A * | 2/1975 | Dosch et al. .................. 205/213 |
| 3,964,982 A | 6/1976 | Kim | |
| 4,936,957 A * | 6/1990 | Dickey et al. .................. 205/96 |
| 5,468,694 A | 11/1995 | Taguchi et al. | |
| 5,482,614 A | 1/1996 | Kondo et al. | |
| 5,925,228 A | 7/1999 | Panitz et al. | |
| 6,455,930 B1 | 9/2002 | Palanisamy et al. | |
| 6,466,881 B1 | 10/2002 | Shih et al. | |
| 6,774,050 B2 | 8/2004 | Ahn et al. | |
| 6,885,035 B2 | 4/2005 | Bhat et al. | |
| 2007/0062032 A1* | 3/2007 | Ter-Hovhannissian ......... 29/840 |
| 2007/0215895 A1* | 9/2007 | Amoh et al. .................... 257/99 |
| 2007/0257335 A1* | 11/2007 | O'Brien ....................... 257/618 |
| 2008/0006837 A1* | 1/2008 | Park et al. ...................... 257/98 |

(Continued)

FOREIGN PATENT DOCUMENTS

WO   WO 2008058446 A1 * 5/2008

OTHER PUBLICATIONS

AW Austral Wright Metals, Aluminum 1100 Product Data Sheet, Austral Bronze Crane Copper Limited, ACN 008 466 840, 2 pages, Published Jan. 2005.

(Continued)

*Primary Examiner* — N Drew Richards
*Assistant Examiner* — John P Dulka
(74) *Attorney, Agent, or Firm* — Davis Wright Tremaine LLP (57) ABSTRACT

This invention relates to the thermal management, extraction of light, and cost effectiveness of Light Emitting Diode, or LED, electrical circuits. An integrated circuit LED submount is described, for the packaging of high power LEDs. The LED submount provides high thermal conductivity while preserving electrical insulation. In particular, a process is described for anodizing a high thermal conductivity aluminum alloy sheet to form a porous aluminum oxide layer and a non-porous aluminum oxide layer. This anodized aluminum alloy sheet acts as a superior electrical insulator, and also provides surface morphology and mechanical properties that are useful for the fabrication of high-density and high-power multilevel electrical circuits.

14 Claims, 10 Drawing Sheets

U.S. PATENT DOCUMENTS

2008/0032473 A1* 2/2008 Bocek et al. ............. 438/253
2010/0067224 A1* 3/2010 Wu ............................. 362/235

OTHER PUBLICATIONS

Thermal Solutions, "Insulated Aluminum Substrates Thermal Solutions for Hi Brightness LED Applications" TT Electronics, Issue May 2006, 6 pages.

A. P. Li, F. Muller, A. Birner, K. Nielsch, and U. Gosele, "Hexagonal Pore Arrays with a 50-420 nm Interpore Distance Formed by Self-Organization in Anodic Alumina" 1998 American Institute of Physics, J. Appl. Phys., vol. 84, No. 11, Dec. 1998, pp. 6023-6026.

G.D. Sulka, S. Stroobants, V. Moshchalkov, G. Borghs, and J.P.Celis, "Synthesis of Well-Ordered Nanopores by Anodizing Aluminum Foils in Sulfuric Acid", Journal of the Electrochemical Society, 149 (7), 2002, pp. D97-D103.

\* cited by examiner

LIGHT EMITTING DIODE SUBMOUNT WITH HIGH THERMAL CONDUCTIVITY FOR HIGH POWER OPERATION

BACKGROUND OF THE INVENTION

Over the past several decades, the performance of light emitting diodes (LEDs) has increased in many ways, including improvements in efficiency, flux output, color rendering, stability of color, and stability of the correlated color temperature of white light. These improvements, and the high reliability of LEDs, make them useful for a wide range of high-brightness illumination applications, including automotive forward lighting and various display applications. However, in order for high-power LEDs to achieve the high lumens output and flux density (as a white light source) that is needed to replace conventional technologies such as incandescent bulbs, fluorescent lighting, and metal halide light sources, the LEDs must be driven at high current levels, which in turn results in high levels of heat generation. Special packaging techniques need to be employed to prevent the degradation of LED quantum efficiency, due to temperature increases. Although some LED applications allow the use of electrically-conducting submount or substrate materials, electrical insulation (high electrical resistance, or low electrical conductivity) is required in many applications. However, many of the best materials for good thermal conductivity are also electrically conducting. Therefore, the development of a high thermal conductivity LED submount or substrate materials that also provides superior electrical insulation, is one of the key issues for addressing LED heat dissipation.

Several types of submount/substrate material, such as PCB (printed circuit board), MCPCB (metal core printed circuit board), ceramic substrate, direct copper bonded substrate and LTCC-M (low temperature co-fired ceramic on metal) substrate have been developed and employed in the prior art as LED submount packages.

The thermal conductivities of dielectric insulator materials such as PCB and MCPCB are about 0.36 W/m°K and about 2 W/m°K, respectively. For ceramic substrate and direct copper bonded substrate, the most frequently used dielectric insulator materials are $Al_2O_3$, and AlN. These materials have a higher thermal conductivity, with typical values of 20-230 W/m°K. For LTCC-M substrate, the major compositions of dielectric material are $SiO_2$, MgO, $Al_2O_3$, and the value of thermal conductivity is much less than 20 W/m°K.

The supporting submount materials, such as FR-4, semiconductor material, pure metals, compound metal alloys, and compound ceramic materials, are commonly applied during the circuit fabrication process. As indicated in U.S. Pat. No. 6,885,035, semiconductor material was primarily used for the submount circuit. The thermal conductivity for typical semiconductor material is about 150 W/m°K. As shown in U.S. Pat. No. 6,455,930, LTCC-M was invented for heat sinking packages. Ceramic materials and a Cu—Mo—Cu related metal compound material were made for circuit boards. However, the complicated process and high production cost will limit the application of these materials.

In another example of the prior device, the ANOTHERM™ circuitry submount uses high temperature anodized 3003/6061 aluminum substrate, that grows up to 35 μm of oxide layer for electrical insulation. The substrate thermal conductivity is about 173 W/m°K and basically the circuit board is fabricated by using a screen printing method.

Another consideration in providing the submount for LED devices involves the morphology and mechanical properties of the submount. To form a stable and firm bond between the LED chip and the submount and between bonding wires and the submount, the morphology of the submount is preferably smooth, and the submount preferably is of sufficient thickness so that it can mechanically support bonds to the LED chip and bonding wires.

SUMMARY OF THE INVENTION

In one embodiment of this invention, a LED chip is bonded to a supporting structure that comprises at least two different layers of anodized aluminum oxide: a porous layer and a non-porous layer. By employing a porous layer and a non-porous layer of anodized aluminum oxide, it is possible to achieve at least some of the above noted desirable and preferred features. Thus, the supporting structure can provide high thermal conductivity and good electrical insulation, while also providing the smooth morphology and mechanical strength that are also preferable features of the LED submount.

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

BRIEF DESCRIPTION OF THE DRAWINGS

FIG. 3 (A) shows the relationship for reflectivity as a function of anodizing current density, for various oxide thicknesses. FIG. 3 (B) shows reflectivity versus anodizing oxide thickness for a fixed current density.

FIGS. 5(A) and (B) show the paths of reflected light from a single LED light source that is mounted on high-reflectivity anodized aluminum alloy sheet plates, with parabolic and angled shapes, respectively.

FIGS. 6(A) and (B) show cross-section views of a single-level circuit with LEDs connected in series, on an anodized aluminum alloy sheet plate.

FIGS. 7(A) and (B) show cross-section views of s single-level circuit with LEDs connected in parallel, on an anodized aluminum alloy sheet plate.

DETAILED DESCRIPTION OF THE PREFERRED EMBODIMENTS

In embodiments of the present invention, the anodized oxide film that is created has an excellent surface morphology, acts as an electrical insulator, and also acts as a high thermal conductivity heat sink for fabricating very high dense high-power LED circuits. The surface morphology for this anodized oxide film is also superior for die attachment and wire bonding.

The above embodiments of the present invention have one or more of the following advantages:

It provides a cost-effective method by using commercial high thermal conductivity aluminum alloy sheet plate 1100 to anodize oxide film.

The LED device in this embodiment contains sequentially porous and non-porous anodizing oxide film layers, through the control of the anodizing concentration of the electrolyte solution, bath temperature and current density or applied voltage.

In one implementation of one of the embodiments, it provides an anodizing porous oxide film in aqueous sulfuric acid of wt less than 10%, at room temperature, and using a current density of less than 10 mA/cm$^2$.

In one implementation of one of the embodiments, it provides an anodizing non-porous oxide film in neutral aqueous borate base solution of wt about 7%, at 50° C.-90° C., and using a constant applied voltage of about 270V.

It provides the formation of porous and non-porous oxide films with a superior surface characteristic, that can be sustained in a period of basic chemical solution, as used in lithography processes.

The LED device in an implementation of one of the embodiments has an additional thin dielectric layer on top of the porous and non-porous oxide layers. With this thin dielectric layer, lower quality anodizing oxide film can be carried out for the lithography process. This dielectric material could be oxide or nitride material, such as silicon oxide or silicon nitride.

One implementation of one of the embodiments provides a high-reflectivity surface from the anodizing oxide film and includes the polishing of the aluminum alloy sheet plate.

It is then possible to provide a high-reflectivity anodizing oxide LED submount, for increased extraction of light from the LEDs.

Another implementation of one of the embodiments provides integrated capacitor structures for use in electrical circuits that are formed on the anodizing aluminum alloy sheet plate.

The LED device in one of the embodiments includes a single-level circuit submount on the anodizing aluminum alloy sheet plate, with a single level of interconnection. The LED dies may contain vertical electrodes, or coplanar electrodes, and may be interconnected either in series or in parallel configurations.

The LED device in another one of the embodiments includes a double-level circuit submount on the anodizing aluminum alloy sheet plate. The second dielectric insulator used to create or define the second level of interconnection could be silicon oxide or nitride material. It is possible to provide a multi-level circuit in the submount on the anodizing aluminum alloy sheet plate. In this way, multichannel circuits can be fabricated. The LED dies may contain vertical electrodes, or coplanar electrodes, and may be interconnected either in series or in parallel configurations.

In at least some of the embodiments of the invention, the total thickness of the porous and non-porous layers of anodized aluminum oxide is less than the 35 microns of the ANOTHERM™ circuitry submount, and thus has higher thermal conductivity than the ANOTHERM™ circuitry submount. In these embodiments, the porous oxide layer has a smooth surface suitable for secure bonding to other layers such as an electrically conductive layer (such as a metallic layer) that is bonded to wire bonds and to the LED chip, either directly, or through other layers. Furthermore, the total thickness of the porous and non-porous layers is such that they have adequate mechanical strength for secure bonding to wire bonds and to the LED chip, without causing holes or cracks to form in the metallic layer or the oxide layers. In one implementation of one of the embodiments, the total thickness of the porous layer and non-porous layers is not less than 1.5 microns but less than about 20 microns, and preferably in a range of about 2 to 20 microns, such as 10 microns.

Embodiment 1

Figure 1A:
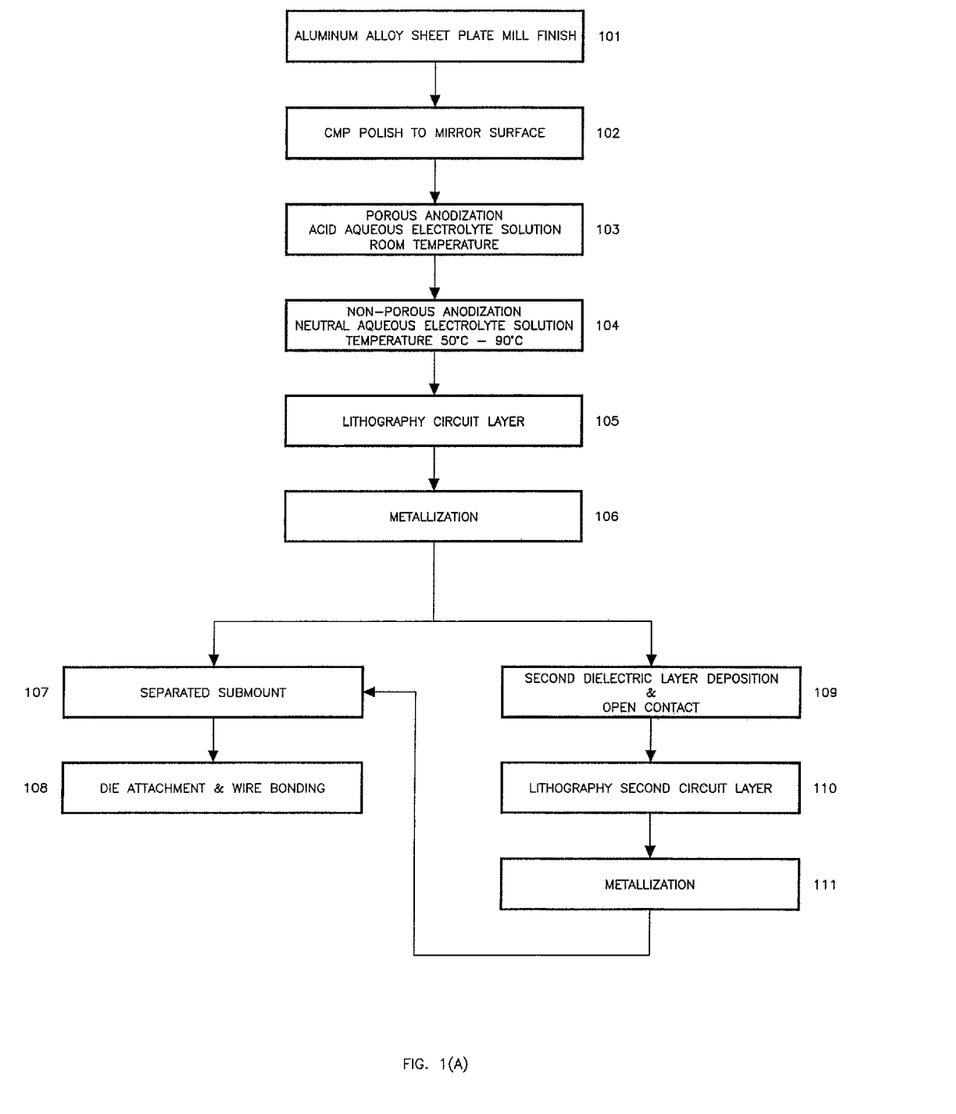
FIG. 1(A) shows a process flow chart to illustrate Embodiment 1.

Embodiment 1 of the present invention, is illustrated in FIG. 1(A) as a process flow chart for the anodizing of a commercial aluminum alloy sheet plate 1100 that contains a minimum of 99% aluminum of thermal conductivity 222 W/m°K, with mill finish 101. The aluminum alloy sheet plate is first degreased in boiling acetone and then rinsed in running de-ionized (DI) water (block 101). A mixed chemical solution from FUJIMI'S PLANERLITE 7000™ polishing slurry series is then used for CMP (chemical mechanical polishing) (block 102). The surface of the aluminum alloy sheet plate is polished until a mirror finish is achieved, and the RMS value of surface roughness is less than 10 nm, as verified by using a KLA-Tencor P-10 surface profile measurement for a length of 300 μm. The structure resulting from steps 101 to 108 will comprise the aluminum alloy sheet plate and the following layers in the order of increasing distance from the aluminum alloy sheet plate: a layer of non-porous aluminum oxide in contact with and right next to the aluminum alloy sheet plate, a layer of mixed non-porous and porous aluminum oxide, a layer of porous aluminum oxide, and a metal layer with at least one LED die and wires attached to the metal layer.

Figure 1B:
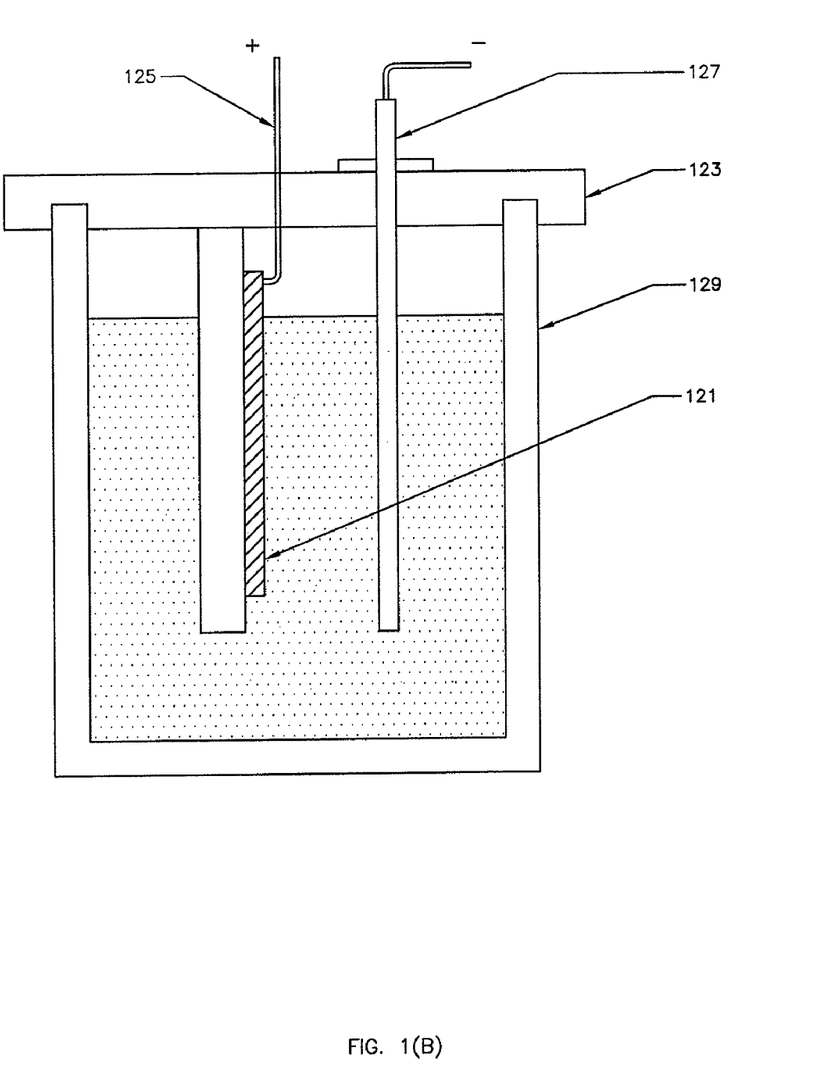
FIG. 1(B) shows a diagram of an apparatus for carrying out the process of FIG. 1(A).

The two-step anodizing process for processing aluminum alloy sheet plate is as follows in reference to FIG. 1(A): in block 101 of FIG. 1(A), the aluminum alloy sheet plate 121 is mounted on a Teflon fixture 123, and connected to the electrode 125 with positive voltage relative to ground as the anode, and a stainless steel plate 127 is used for the cathode electrode as illustrated in FIG. 1(B). In block 103 of FIG. 1(A), the porous oxide film is formed by oxidizing all exposed surfaces of the aluminum alloy sheet plate 121 in a dilute aqueous sulfuric acid of wt less than 10% in bath 129 as illustrated in FIG. 1(B) and at a constant current density of 3.5 mA/cm$^2$, at room temperature for 2 hours. The oxide thickness at this point is about 10 μm. This porous type of oxide has an inferior resistance to (electrical) dielectric breakdown. Even if the oxide growth thickness was increased to 20 μm, the breakdown voltage is less than 1 volt as the larger area electrode is fabricated. To improve the level of electrical insulation, the porous oxide cells are either sealed in boiling water to form a hydrated film, or else it is necessary to grow an additional barrier layer to prevent electrical leakage.

Figure 2:
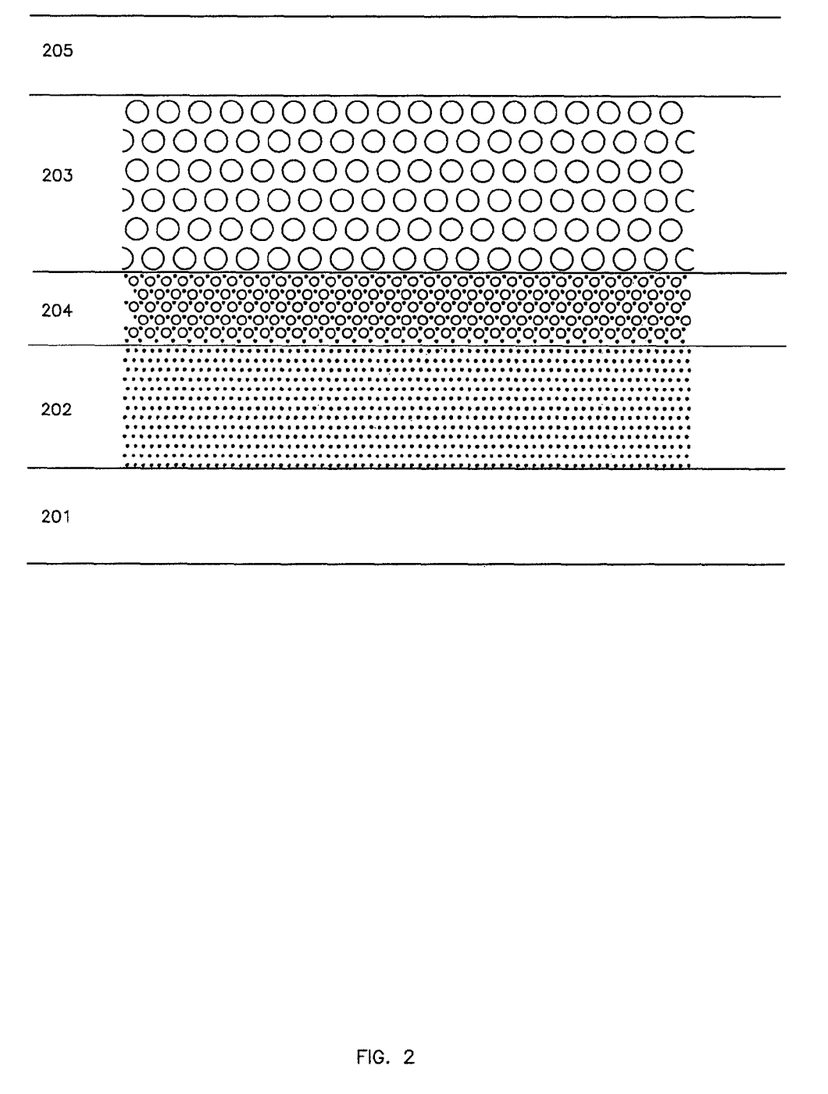
FIG. 2 shows a cross-section view of Embodiment 2.

Normally, this additional barrier non-porous oxide layer can be produced (block 104) between the porous oxide layer and the aluminum alloy sheet plate by anodizing the aluminum alloy sheet plate 121 using borate or tartrate-based electrolyte solutions in bath 129 as illustrated in FIG. 1(B). An intermediate layer comprising a mixture of porous oxide and non-porous oxide may also be formed as well between the porous oxide and non-porous oxide layers. In block 104 the second step of anodizing is accomplished in neutral aqueous ammonium pentaborate solution to 6-7 wt % in bath 129 as illustrated in FIG. 1(B). The PH is about 7.5. As with the first step of anodizing, a stainless steel plate 127 is used for the cathode electrode. To avoid electrical discharge in the electrolyte solution, a constant voltage of 270 V is applied to the sample at a temperature within a range of 50° C.-90° C. for more than 30 minutes, resulting in porous oxide and non-porous oxide layers. In addition to forming the non-porous layer, this second step of anodizing also alters the porous oxide layer as well in an important way. If the temperature of the electrolyte solution is too high, the porous oxide film becomes a rough, saturated hydrated film. On the other hand, if the electrolyte solution temperature in this anodizing step is too low, the porous oxide will be too soft, and will be less resistant to chemical solutions. While a voltage of 270 volts is used in this embodiment, other voltages may be used instead, such as a voltage at or above (i.e. not less than) about 40 volts. The submount structure resulting from processes in blocks 101-104 is similar to that of FIG. 2, except that the dielectric layer in FIG. 2 is not present.

Figure 1C:
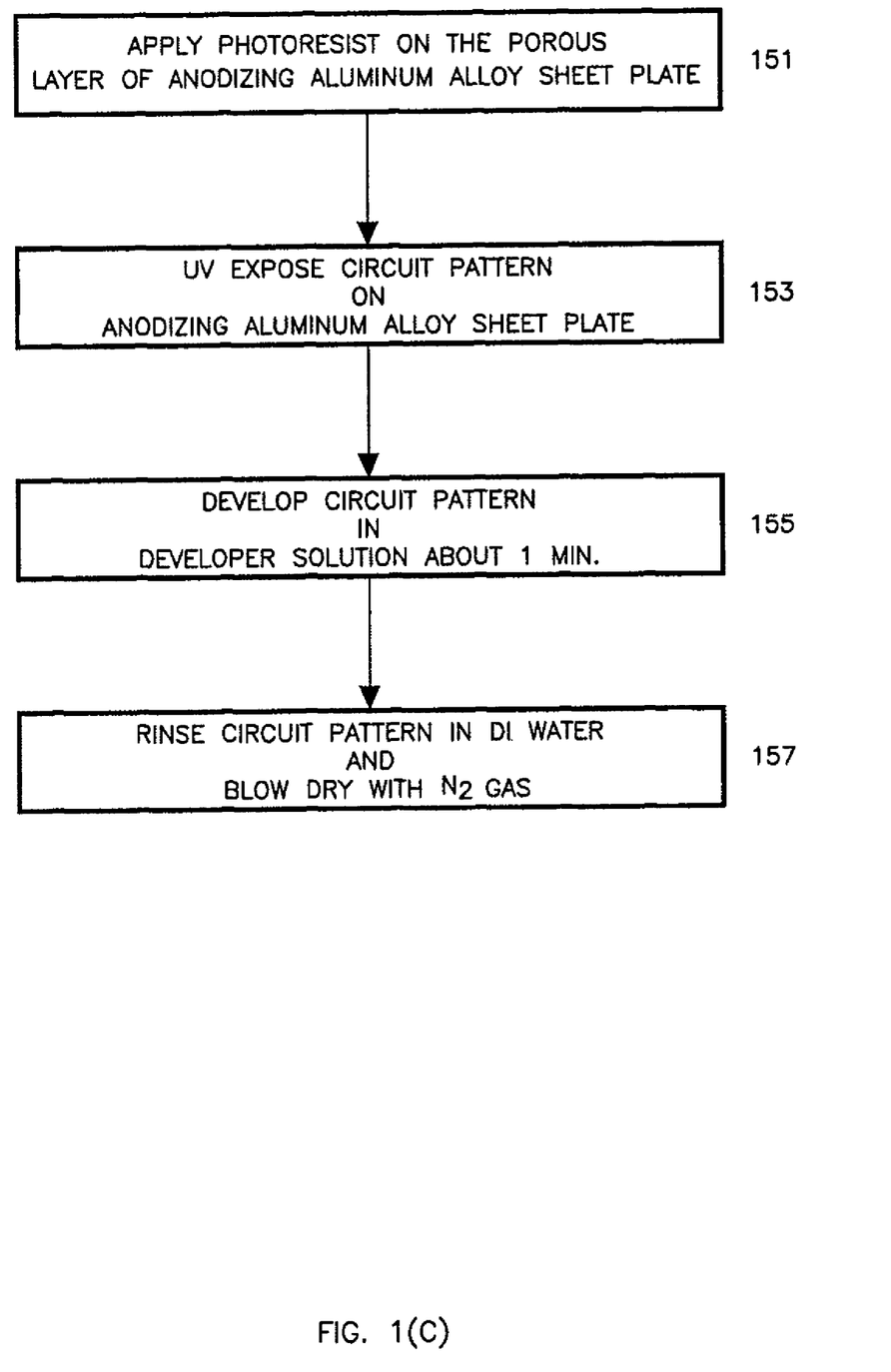
FIG. 1(C) shows a process flow chart to illustrate in more detail one of the blocks in FIG. 1(A).

After the porous oxide and non-porous oxide layers have been formed in blocks 101-104 of FIG. 1(A), the structure undergoes lithographic processes in block 105 of FIG. 1(A), for forming a layer of electrically conductive material with a pattern for forming the die attaché pads and electrodes for the LED device. Conventional lithographic processes for semiconductors may be used for this purpose. This is illustrated in FIG. 1(C), such as by forming or applying a photoresist layer (block 151) on the porous oxide layer, exposing selected areas of the photoresist layer to UV light through a mask (block 153), and then exposing the structure to developer solution to develop certain portions (either the exposed or unexposed portions, but not both) of the photoresist layer (block 155), and rinsing with DI water (block 157). After the completion of the processes in block 105, in block 106 of FIG. 1(A), an electrically conductive materials is deposited, such as by PVD (physical vapor deposition) methods, on the exposed portions of the porous oxide layer and then the photoresist layer is removed away by photoresist remover.

Thus, when the temperature of the electrolyte solution during the second step (block 104) of anodizing of FIG. 1(A) is within a range of 50° C.-90° C., the pores in the porous layer tend to be hydrated and close, thereby rendering the porous layer more resistant to the basic (alkaline) developer solution employed in the subsequent lithographic steps for forming circuit patterns of an electrically conductive layer, such as electrodes and die attaché pads, on the porous layer. Developing circuit pattern (block 155) in the subsequent lithographic steps is typically performed within 1 minute. Hence as long as the porous layer is resistant to the basic (alkaline) developer solution employed in during the circuit pattern development step of the subsequent lithographic steps for not less than (or for more than) 1 minute, then the resulting supporting structure of the submount will have structural integrity and be strong enough mechanically to support the LED chips, and for bonding to the chips and to wire bonds through the electrically conductive layer. This is because after the circuit pattern development step in the lithographic steps has been completed within 1 minute, the porous layer will no longer be in contact with the basic (alkaline) developer solution, so that it retains its structural integrity and mechanical strength after the lithographic process. It is found that where the porous layer has been exposed to an environment at a temperature within a range of 50° C.-90° C. for at least 30 minutes under the conditions described herein during the second step of anodizing of FIG. 1(A), that the porous layer is resistant to the basic (alkaline) developer solution employed in the subsequent lithographic steps for not less than 1 minute, and in fact sometimes for more than 1 minute.

At the beginning of the second anodizing step the maximum current density is 2.34 mA/cm$^2$, which decreases to 0.13 mA/cm$^2$ by the end of the process. This decrease in current density is due partly to the porous oxide hydrate and the non-porous oxide forming on the adjacent layer of the upper aluminum alloy sheet plate. To enhance the oxide layer's mechanical strength during die attach and wire bonding of the LEDs, the total oxide thickness is preferably thicker than 1 μm, such as 1.5 μm. The non-porous anodizing layer is limited to a thin layer, since the growth thickness is proportional to the applied voltage and is on the order of 10-20 angstroms per volt. The combined thickness of the porous and non-porous oxide layers makes the total oxide thickness suitable for use as an LED submount package. In addition to oxide thickness, the quality of oxide surface also affects the lithography circuit layer formed in block 105. In general, the developer solution of positive photoresist is basic (i.e. alkaline). The composition of the photoresist developer solution contains materials such as tetramethyl ammonium hydroxide, sodium hydroxide, potassium borate, and is also reactive to aluminum, and aluminum oxide related compound materials. The rough reactive surface of aluminum oxide will degrade the adhesion of the metal layer formed in block 106 to the porous oxide layer. Usually the surface morphology resulting from both conventional hard anodizing aluminum oxide and from porous oxide by sealing in boiling water is rough and has a poor adhesion to the following deposited layer even though those oxide films are non-porous. In one embodiment of this invention, by combining both porous and non-porous anodizing processes to grow a superior oxide film that prevents quick reaction to the developer solution, high quality circuits can be fabricated on the aluminum oxide submount for high power LED application. It is found that the root-mean-square (RMS) roughness of the porous oxide layer surface is not more than about 10 or 20 nm.

The metal layer formed in block 106 comprises adhesion, buffer, barrier and bonding layers. The adhesion layer could be Ti, V, Cr and Al, in a thickness of 10 to 100 nanometers. The buffer layer could be Al, Ag, Cu or Ni, with a thickness greater than 100 nanometers. The barrier layer could be Nb, Ti, Ta, Cr, Mo, W or Pt, with a thickness of 100 nanometers. The top-bonding layer is Au with a thickness in the range of one micron. The adhesion layer is adapted for attachment to the porous oxide layer. The barrier layer reduces or prevents undesired diffusion of impurities into the bonding layer which is in contact with or in proximity to the LED or bonding wires. These layers may be deposited sequentially, for example.

For a single-level circuit, after separating each submount (block 107) from the whole aluminum alloy sheet plates the LED die is attached on metallized layer from step 106 and makes a wire bonding connection (block 108).

The dielectric electric strength of anodizing oxide film is measured by using a power supply similar to the Good Will GPR-100H05D. The leakage current is monitored by using an Agilent 34401A digit multimeter. The electric breakdown voltage is dependent on the purity of the aluminum alloy sheet plate, the overall oxide thickness, and the applied voltage during the non-porous anodizing process. In this case, the breakdown voltage is greater than 400 V, and is therefore suitable for die attachment and wire bonding processes. While breakdown voltage is greater than 400 V can be achieved as described above, for some applications, a breakdown voltage of not less than 100 volts may be adequate; such and other variations are within the scope of the invention. A breakdown voltage of not less than 100 volts may be achieved, as illustrated below in Embodiment 2, where the total oxide thickness is about 1.5 microns.

For a double-level circuit, a second dielectric insulator layer may be formed (block 109 of FIG. 1(A)), using materials such as $Al_2O_3$, $SiO_2$, $Si_3N_4$, AlN and BeO. This layer could be provided by PVD (physical vapor deposition) methods, resistance-heated evaporation, electron-beam evaporation, magnetron sputter deposition and ion beam sputter deposition, by conventional high temperature PECVD (plasma-enhanced chemical vapor deposition), or by dual RF power low temperature PECVD. The layer thickness of this second dielectric insulator layer is preferably thicker than that of the first metal layer. To fabricate this thick insulator the process parameters that need to be optimized include temperature, choice of DC or RF power, flow rates of process gases, and chamber pressure. Close control of these process parameters is necessary in order to avoid excess stress build-up, resulting in film cracking, and is also needed to retain good dielectric insulation characteristics. For example, the layer of $SiO_2$ is deposited by using conventional PECVD. The temperature can be lower to 250° C. from a typical 300° C. and the value of RF power is less than 500 W to reduce the stress of film without major degrade oxide quality. The dielectric layer may be opened up by lift-off methods, or by chemical etching methods, for the second layer circuit contact. A photoresist pattern is fabricated (block 110) by using conventional lithography methods for the second layer metal circuit deposition. A metal layer be deposited by PVD method (block 111), and comprises an adhesion layer, a barrier layer, and a bonding layer, such as Ti, Pt, and Au as described previously.

Embodiment 2

In Embodiment 2 of the present invention, the aluminum alloy sheet plate 201 has been processed through the chemical mechanical polishing (CMP) step, and the RMS value of the surface roughness is less than 10 nm. The porous oxide layer 203 is grown under aqueous sulfuric acid of wt less than 10% and constant current density of 2.80 $mA/cm^2$, at room temperature for 15 minutes. The non-porous oxide layer 202 is accomplished by use of a neutral aqueous ammonium pentaborate solution of wt 4-10%, at bath temperature less than 90° C. To avoid electrical discharge in the electrolyte solution, a constant voltage of 270 V is applied to the sample. At the beginning of this process the maximum current density is 2.34 $mA/cm^2$, decreasing to 0.25 $mA/cm^2$ by the end of the process. A transition layer 204, which has poorer electric insulator characteristics, is a mixed phase of porous and non-porous oxides. To avoid blocking the thermal path from the LED die, a thin dielectric layer 205, with thickness less than 100 nanometers, is coated on the top of 203 by using PVD or PECVD methods. This thin dielectric layer, composed of materials such as a compound oxide, or a compound nitride, can be sustained in developer solution. With the addition of this thin layer 205, the quality of the anodizing oxide surface may not need to be as tightly controlled, as described in Embodiment 1. Hence the tolerances of parameters such as the concentration of the electrolyte solution and the bath temperature for anodizing oxide are not so critical. The total thickness of anodizing oxides in this embodiment is about 1.5 μm. With such total thickness, the thermal conductivity is much enhanced while retaining its electrical insulating properties.

The thermal conductivity of the LED submounts from the embodiments 1 and 2 may be calculated as follows. To simplify analysis, only consider the vertical heat flow. The thermal resistance is proportional to the device thickness and is inversely proportional to the device area and device material thermal conductivity. The system effective thermal conductivity can be calculated from the effective thermal resistance if the individual material thickness and thermal conductivity are known. For example 1, the thickness of aluminum oxide is 10 μm, and the thickness of aluminum alloy sheet plate is 1 mm. The effective thermal conductivity is 202 W/m°K. Example 2, the thickness of $SiO_2$ and aluminum oxide are 0.1 μm and 1.5 μm, respectively. With a 1 mm thick of aluminum alloy sheet plate, then the effective thermal conductivity is 215 W/m°K. The reflectivity of the submount is also higher for thinner oxide layers as will be apparent from the discussion below. The electrical breakdown voltage of the LED submount in embodiment 2 is about 100 V. If the anodizing conditions in embodiment 2 are kept basically the same as in Embodiment 1, then the oxide thickness is about 10 μm. With an additional thin $SiO_2$ layer of thickness 80 nm in embodiment 2, the electrical breakdown voltage is about 475 V. Both of the oxide layers are suitable for die attachment and for wire bonding.

Figure 3:
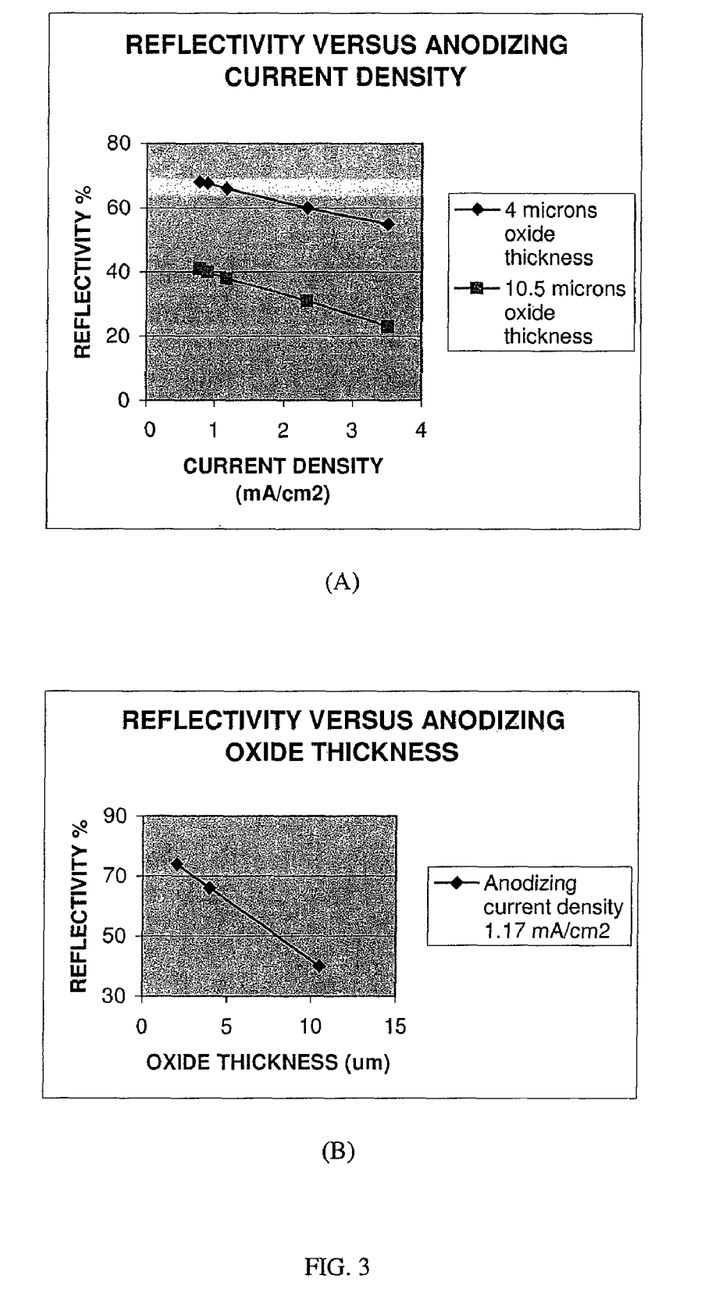

FIG. 3(A) shows the relationship between reflectivity and anodized current density as a function of anodized aluminum oxide thickness. The reflectivity measurement is performed by a Shimadzu UV-3101 PC scanning spectrophotometer. The measured spectrum is scanned from 400 nm to 700 nm and the average values are calculated for the analysis. All samples were prepared using two-step anodization in accordance with Embodiment 1. The porous oxide layer was implemented using various current densities ranging from 0.78 $mA/cm^2$ to 3.51 $mA/cm^2$, applied for 40 minutes to 5.5 hours. The non-porous oxide layer was implemented by applying a constant voltage of 270 V for more than 30 minutes. The reflectivity is inversely proportional to current density for a given thickness. With lower current density applied, the small oxide grain boundary grows, and a smoother surface results. For oxides with a thickness of 4 μm, reflectivity can be measured as high as 68%, when a current density of 0.78 $mA/cm^2$ is applied. However, the reflectivity drops down to 23% as current density increases to 3.51 $mA/cm^2$, for a 10.5 μm oxide thickness. Thus, with oxides with a thickness in a range of 1.5 to 5 μm, reflectivity of not less than about 60% of the incident light is achievable. FIG. 3(B) shows the relationship between reflectivity and oxide thickness for a given current density of 1.17 $mA/cm^2$. The reflectivity is as high as 74% when the oxide thickness is approximately 2 μm.

Figure 4:
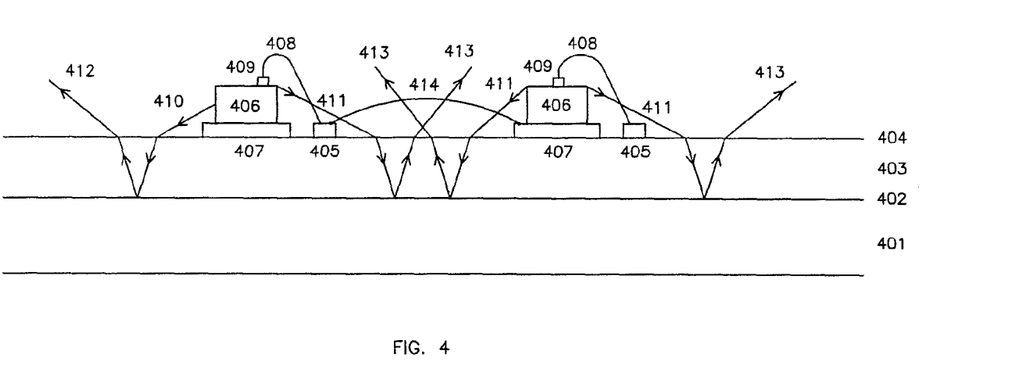
FIG. 4 shows the paths of reflected light, from multiple LED light sources mounted on a high-reflectivity anodized aluminum alloy sheet plate.

FIG. 4 shows another embodiment of the present invention. 401 is the planar structure of an aluminum alloy sheet plate with mirror-polished surface 402. The anodized oxide film 403 is accomplished by using low current density and the high reflectivity achieved from 402, 403 and 404, the boundary between the ambient medium and the top oxide surface, can be more than 78% in the visible spectrum. Both of the circuit electrodes 407 and 405 comprise adhesion, buffer, barrier and bonding layers, which are described in Embodiment 1. The dies 406 are attached on the circuit electrodes 407 by eutectic bonding. The gold wires 408 are bonded between the die electrode pads 409 and circuit electrodes 405. The gold wire 414 is connected between two circuit electrodes 405 and 407. The dies emit light from the sides 410, 411 and refract at 404, then propagate in aluminum oxide film 403 and reflect at 402. These upwardly-reflecting light paths 412 and 413 serve to enhance the extraction of LED luminous intensity.

Figure 5:
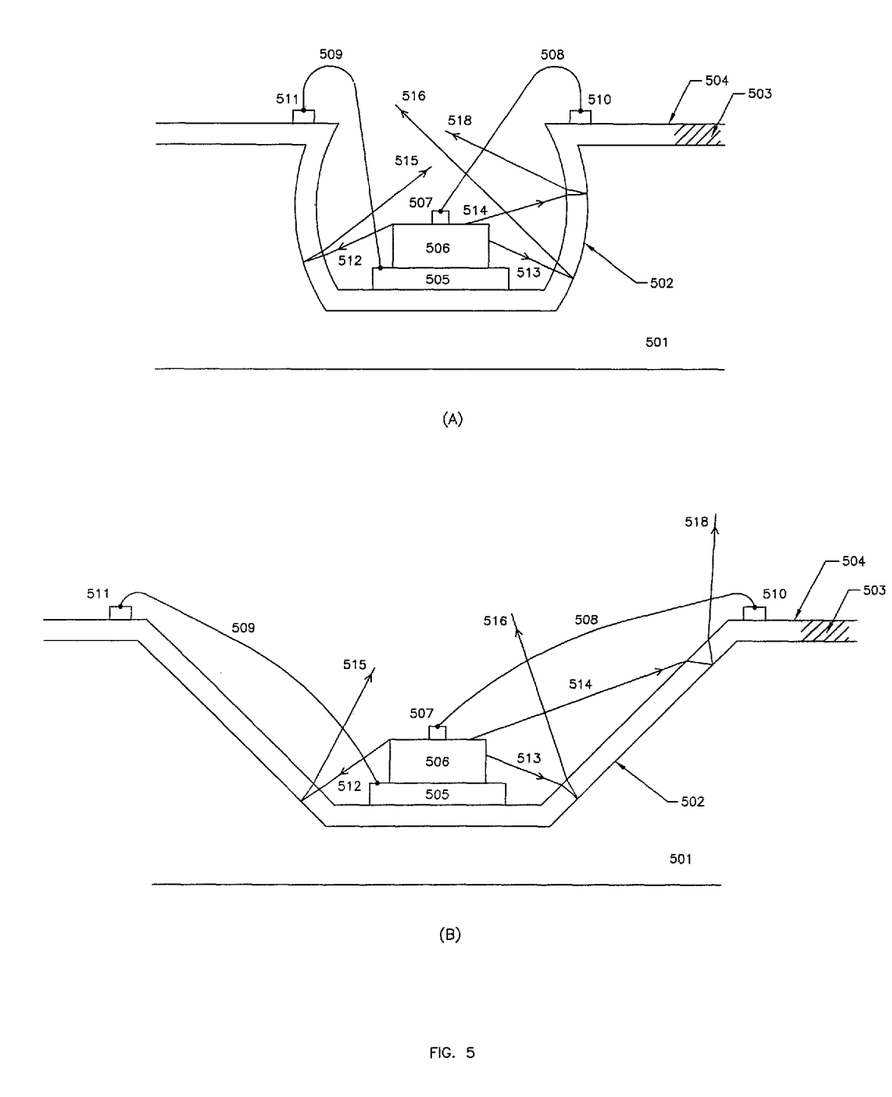

FIG. 5 shows another embodiment of the present invention. The polished mirror surface of the aluminum alloy sheet plate 501 is formed to a curved (e.g. parabolic) shape 502(A) or is etched to a gradient angle shape 502(B). The anodized oxide film 503 is achieved using a low current density electrolyte solution, as described in Embodiment 1. In accordance with FIG. 3, there is a low propagation loss of light in this thin oxide, if it was anodized in a low current density condition. As a result, the reflected light from the surfaces of 502 and 503 can be extracted with high efficiency. The circuit electrode metals 505, 510 and 511 comprise adhesion, buffer, barrier and bonding layers as described previously. The LED die 506 is attached onto the electrode metal 505 by eutectic bonding. The gold wire 508 is bonded between the die electrode pad 507 and circuit electrode 510, and the wire 509 is connected between the two circuit electrodes 505 and 511.

The die emits light from the top surface 514, as well as from the sides 512 and 513, and the light is refracted at 504, the boundary between the ambient medium and the oxide film, then propagates in a low-loss oxide film 503, and is then reflected at the mirror surface 502 of the polished aluminum alloy sheet plate. The reflected light from the surface 502, which is formed in a shaped (e.g. angular) geometry structure, is directed in an upward direction. Most of the light from 514, 512 and 513 would be reflected with low loss into 518, 515 and 516, respectively. With this additional reflected light, the overall luminous intensity of the LED is strengthened.

Figure 6:
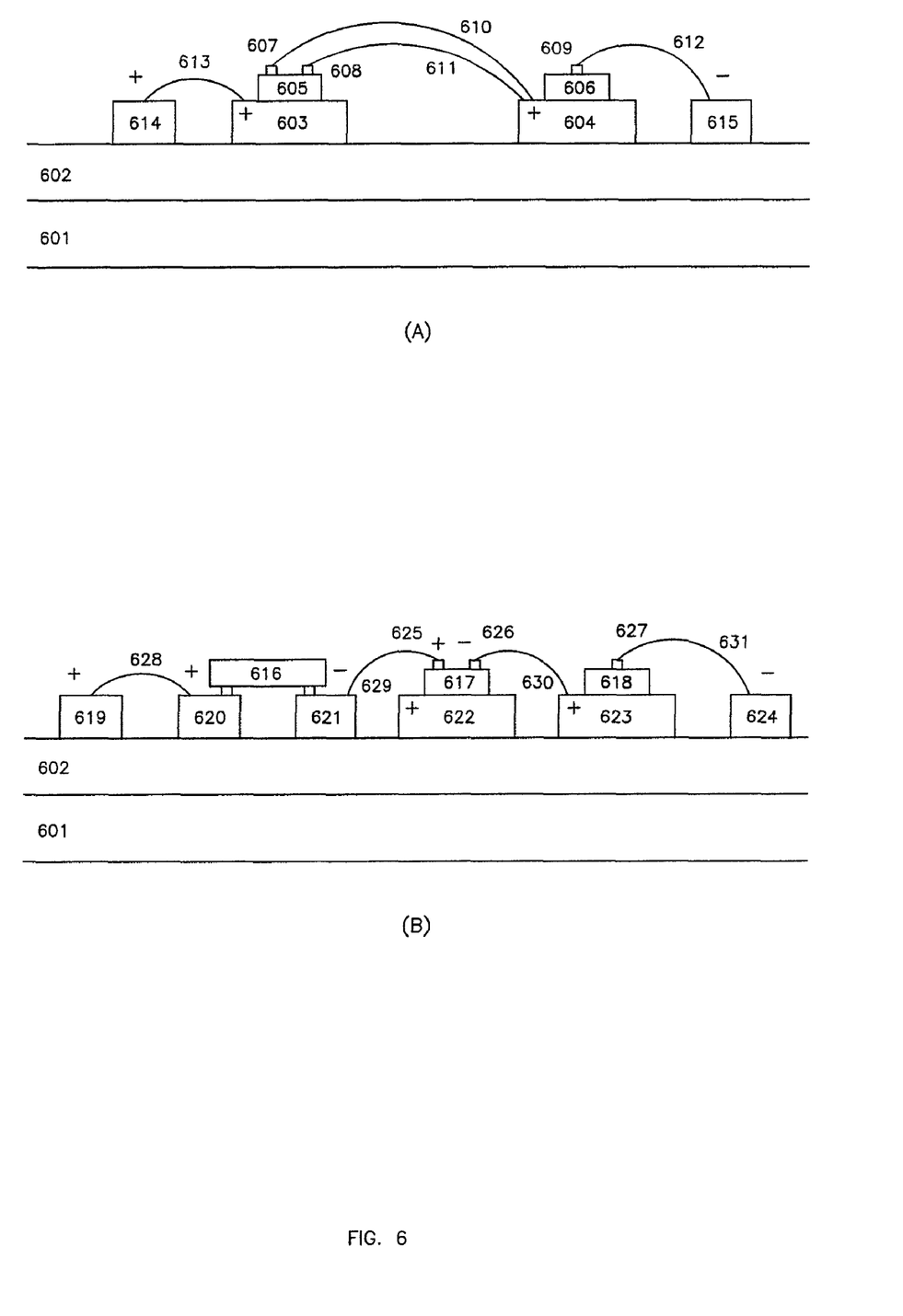
Figure 7:
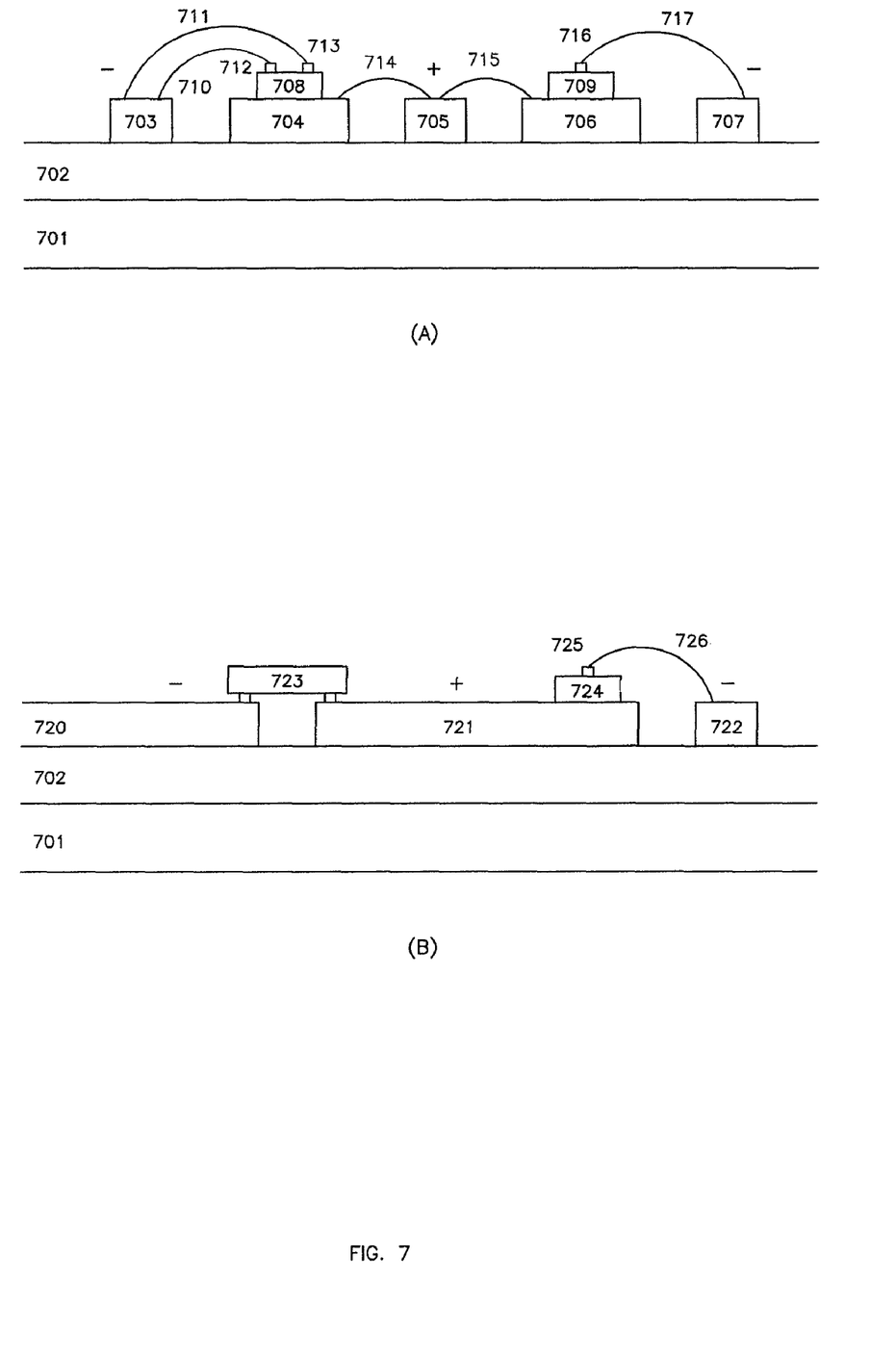

FIGS. 6 and 7 show another embodiment of the present invention. The single-level circuit for LED die attachment could be in series (FIG. 6) or in parallel (FIG. 7) configuration. The anodized oxide 602 is grown on the aluminum alloy sheet plate 601 as described in Embodiment 1. The circuit electrodes 603, 604, 614 and 615 consist of adhesion, buffer, barrier and bonding layer metals. In FIG. 6(A) the attached dies 605 and 606 have a vertical electrode configuration with a common backside positive or anode electrode, and the corresponding upward negative or cathode electrode pads are 607, 608 and 609, respectively. The gold wires 610, 611 and 612 are connected between die electrode pads 607, 608, 609 and circuit electrodes 604 and 615, respectively. The gold wire 613 is connected between two circuit electrodes 603 and 614. The circuit electrodes from 614 (positive) to 615 (negative) are formed as a series circuit. The LED dies 605 and 606 could be AlInGaP or InGaN/GaN base materials, and the typical driving voltages at 350 mA are 2.5 V and 3.5 V, respectively. In this series circuit, the total die number can be as high as 100, assuming a sufficiently high driving voltage.

In FIG. 6(B) the attached dies could be configured with coplanar electrodes such as a flip chip with electrodes face down 616, a chip with electrodes face up 617, or a vertical electrode chip 618. The flip chip 616 is bumped onto the circuit electrodes 620 and 621, and the gold wire 629 is connected between negative circuit electrode 621 and positive electrode pad 625 of die 617. The gold wire 630 is connected between negative electrode pad 626 of die 617 and positive circuit electrode 623. The gold wire 631 is connected between negative electrode pad 627 of die 618 and cathode circuit electrode 624. The gold wire 628 is connected between circuit electrodes 620 and anode circuit electrode 619. From circuit electrode 619 to circuit electrode 624, a series circuit is formed, with the mixed geometry structures of the LED dies.

In FIG. 7(A), with the vertical electrode dies configured in a parallel circuit; the anodized oxide film 702 is grown on the polished aluminum alloy sheet plate 701 as described in Embodiment 2. The circuit electrodes from 703 to 707 comprise the adhesion, buffer, barrier and bonding layers. The vertical electrode LED dies 708 and 709, fabricated from AlInGaP and InGaN/GaN base materials, respectively, are attached onto the circuit electrodes 704 and 706, respectively. Both of the gold wires 710 and 711 are connected between the negative electrode pads 712, 713 of the die 708 and cathode circuit electrode 703, respectively. The gold wire 717 is connected between negative electrode pad 716 of the die 709 and cathode circuit electrode 707. The gold wires 714 and 715 are connected between circuit electrodes 704, 706 and common anode electrode 705, respectively.

In FIG. 7(B), the coplanar and vertical electrode dies are configured in a parallel circuit; the anodized oxide film 702 is grown on the polished aluminum alloy sheet plate 701 as described in Embodiment 2. The circuit electrodes from 720 to 722 comprise the adhesion, buffer, barrier and bonding layers. The coplanar and vertical electrode LED dies 723 and 724, fabricated from AlInGaP and InGaN/GaN base materials, respectively, are attached on the circuit electrodes 720 and 721. The coplanar electrodes die 723 could be a flip chip with electrodes face down, or a chip with electrodes face up. The die 723 is attached on the negative circuit electrode 720 and positive circuit electrode 721. The gold wire 726 is connected between negative electrode pad 725 of die 724 and cathode circuit electrode 722. In these parallel circuits, the combination of die geometry structures could be both vertical electrode chips, coplanar electrodes face up chips, coplanar electrodes face down flip chips, or other combinations.

Figure 8:
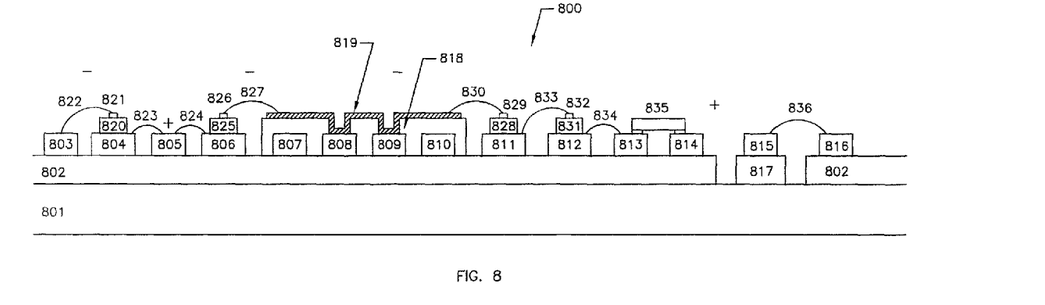
FIG. 8 shows a cross-section view of a double-level circuit on an anodized aluminum alloy sheet plate.

FIG. 8 shows another embodiment of the present invention. To implement the dense submount circuitry required by a multichannel LED lighting module, this embodiment uses integrated double-level metallization. 800 is the generalized cross-section drawing of the double-level circuitry. The anodized oxide film 802 is grown on the polished aluminum alloy sheet plate 801. The high-density circuit electrodes/lines 803 to 816 are fabricated using a conventional lithography method. The metal layers of circuit electrodes consist of adhesion, buffer, barrier and bonding layers. The spacing between circuit lines and bonding pads, between bonding pads and adjacent bonding pads, and between circuit lines and adjacent circuit lines, are less than 100 microns in some circuit implementations. The anodized oxide layer 817 is isolated from the other bulk oxide layer 802 by using conventional lithography and etching methods. By implementing a comb pattern in the metal layer 815 and the oxide layer 817, integrated capacitors can be formed on this circuit. To electrically insulate circuit lines 807 and 810, the second dielectric insulator layer 818, which is formed of a silicon oxide film deposited by a PECVD process, provides an insulating cover over those circuit lines. The circuit lines 807 and 810 are linked to the other two-channel LED circuits. To contact the second metal layer to the first metal layer, the dielectric insulator 818 is opened by lithography and etching methods on the top of the first layer circuit electrodes 808 and 809. The second metal layer 819 is patterned by lithography method and metallized by a physical vapor deposition method.

The dies 820, 825, 828 and 831 are attached onto the circuit electrodes 804, 806, 811 and 812, respectively. The gold wire 822 is connected between cathode circuit electrode 803 and negative electrode pad 821 of die 820. The gold wire 827 is connected between the second circuit electrode 819 and negative electrode pad 826 of die 825. The gold wire 823 is connected between circuit electrode 804 and common anode electrode 805. And the gold wire 824 is connected between circuit electrode 806 and common anode electrode 805. From electrode 803 to electrode 827, it is configured as a parallel circuit.

The gold wire 830 is connected between the second circuit electrode 819 and negative circuit electrode 829 of die 828. The gold wire 833 is connected between positive circuit electrode 811 and negative electrode pad 832 of die 831. The gold wire 834 is connected between two circuit electrodes 812 and 813. The chip resistor or chip inductor 835 is bumped onto the circuit electrodes 813 and 814. The gold wire 836 is connected between the integrated capacitor 815 and circuit electrodes 816. From anode circuit electrode 814 to negative metal layer 819, it is configured as a series circuit, with a chip resistor or inductor and an integrated capacitor available for other circuit functions. Overall, the integrated double-level submount circuit could incorporate multiple active components such as LED dies and photodiodes, or passive components such as chip resistors, chip inductors, thermistors, or integrated capacitors.

While the invention has been described above by reference to various embodiments, it will be understood that changes and modifications may be made without departing from the scope of the invention, which is to be defined only by the appended claims and their equivalents.

What is claimed is:

1. A LED device comprising:
 a supporting structure comprising at least two different layers of anodized aluminum oxide, a porous layer, a non-porous layer and an electrically conductive layer over said porous layer; and
 at least one LED chip bonded to said supporting structure, wherein said porous layer is formed first in an anodizing process followed by formation of said non-porous layer in a subsequent anodizing process, said at least one LED chip bonded to said electrically conductive layer, said electrically conductive layer formed by means of a lithographic process that uses a developer solution, said porous layer being resistant to said developer solution for more than 1 minute, wherein during the formation of the non-porous layer, said supporting structure is in an environment that is at a temperature that is within a range of about 50° C. to 90° C.

2. The LED device of claim 1, said electrically conductive layer comprising a metallic material.

3. The LED device of claim 1, further comprising at least one wire that is bonded to said electrically conductive layer and to the at least one LED chip.

4. The LED device of claim 3, said electrically conductive layer comprising a plurality of portions electrically isolated from one another to serve as an attaché pad or electrodes for the LED device.

5. The LED device of claim 1, said electrically conductive layer comprising a barrier film for reducing diffusion of impurities into portions of said electrically conductive layer.

6. The LED device of claim 1, said supporting structure further comprising a dielectric layer between the porous and non-porous layers on one side and said electrically conductive layer on the other.

7. The LED device of claim 1, said electrically conductive layer being in contact with said porous layer.

8. The LED device of claim 1, said supporting structure bonded to at least a second LED chip in addition to said at least one LED chip, said device further comprising at least one additional electrically conductive layer over said supporting structure, said electrically conductive layers being a part of a multi-level electrical circuit, said device further comprising a wire connecting said at least second LED chip to said at least one additional electrically conductive layer.

9. The LED device of claim 8, further comprising at least one dielectric layer between the electrically conductive layers.

10. The LED device of claim 1, said at least two different layers of anodized aluminum oxide having a total thickness of not less than about 1.5 microns but less than about 20 microns.

11. The LED device of claim 10, said at least two different layers of anodized aluminum oxide having an optical reflectivity of not less than about 60% of incident light.

12. The LED device of claim 1, wherein a breakdown voltage of said supporting structure is not less than about 100 volts.

13. The LED device of claim 1, wherein said at least two different layers of anodized aluminum oxide have a curved or angular shape.

14. The LED device of claim 1, said supporting structure further comprising a layer of a mixture of porous anodized aluminum oxide and non-porous anodized aluminum oxide between the at least two different layers of anodized aluminum oxide, a porous layer and a non-porous layer.

* * * * *